United States Patent
Lin et al.

(10) Patent No.: US 7,547,853 B2
(45) Date of Patent: Jun. 16, 2009

(54) CONTROL SWITCH CONNECTION STRUCTURE

(75) Inventors: Tzu Chih Lin, Hsinchu (TW); Wen Hsu Chang, Hsinchu (TW)

(73) Assignee: Altek Corporation, Hsinchu (TW)

( * ) Notice: Subject to any disclaimer, the term of this patent is extended or adjusted under 35 U.S.C. 154(b) by 664 days.

(21) Appl. No.: 11/376,225

(22) Filed: Mar. 16, 2006

(65) Prior Publication Data

US 2007/0215443 A1    Sep. 20, 2007

(51) Int. Cl.
*H01R 33/00* (2006.01)
(52) U.S. Cl. .................. 200/51 R; 200/51.11; 200/292
(58) Field of Classification Search ............... 200/51 R, 200/51.11, 51.12, 292, 293, 296, 5 A, 5 R; 341/20, 22, 35; 345/156, 157, 160, 161, 345/167–169, 173, 184; 174/520, 521, 549, 174/550, 559, 250, 255, 260, 75 F, 138 G
See application file for complete search history.

(56) References Cited

U.S. PATENT DOCUMENTS

| | | | | |
|---|---|---|---|---|
| 4,181,964 A | * | 1/1980 | Moore et al. ................ | 361/680 |
| 4,261,042 A | * | 4/1981 | Ishiwatari et al. ........... | 708/138 |
| 4,368,369 A | * | 1/1983 | Matsumoto et al. ......... | 200/511 |
| 4,539,445 A | * | 9/1985 | Jabben ....................... | 200/5 A |
| 4,678,249 A | * | 7/1987 | Black et al. .................. | 439/77 |
| 5,187,647 A | * | 2/1993 | Kaneko ...................... | 361/680 |
| 6,148,183 A | * | 11/2000 | Higdon et al. ........... | 455/575.1 |
| 6,344,621 B1 | * | 2/2002 | Shiratori et al. .......... | 200/61.54 |
| 6,388,883 B1 | * | 5/2002 | Serizawa et al. ............ | 361/752 |
| 6,967,295 B2 | * | 11/2005 | Ting ........................ | 200/51 R |

* cited by examiner

*Primary Examiner*—Michael A Friedhofer
(74) *Attorney, Agent, or Firm*—Rosenberg, Klein & Lee

(57) ABSTRACT

A control switch connection structure is proposed, in which a control switch of an electronic device is set up on a frame, and two conducting strips are adhered onto the frame. The control switch is electrically connected to a circuit board via these two conducting strips. The setup steps of flexible printed circuit board and flat flexible cable of the control switch in the prior art can thus be saved to lower the manufacturing cost and shorten the manufacturing process of electronic device.

11 Claims, 2 Drawing Sheets

CONTROL SWITCH CONNECTION STRUCTURE

BACKGROUND OF THE INVENTION

1. Field of the Invention

The present invention relates to a connection structure and, more particularly, to a control switch connection structure with a low setup cost and a small number of components.

2. Description of Related Art

With fast development of high-tech industries and technologies, many electronic devices have evolved frequently with time. In recent years, the functions of portable products have been diversified to provide flexible usages for users to deal with their everyday work or personal affairs without restrictions in situation and time. One can immediately access information and take the information with him. In order to make portable products more friendly in use and more convenient in portability, their shapes constantly make progress toward more and more compactness. Not only the internal components are precisely designed, the design of external mechanisms also pay much attention to delicacy and beauty.

Today's portable mainstream electronic products are digital cameras. Because of such factors as delicacy and manipulation performance, the operation control key of digital cameras is generally set up at the corner. Therefore, when setting up the operation control key, it is necessary to first connect the operation control key to the circuit board via a flexible printed circuit (FPC) connector. Moreover, owing to the factor of circuit layout, manufacturers have to achieve locking with screws sometimes. Besides, when assembling the key switch, a flat flexible cable is used for connection, and contacts of the key switch are directly connected to electric wires by means of manual soldering. In other words, the setup of the key switch can be finished only after complicated steps.

In addition to complicated steps, the conventional technique of setting up the key switch also occupies the usable area of the circuit board to lower the use efficiency of circuit board. Moreover, screws are used to lock the FPC connector sometimes to increase the processing cost. Besides, the key switch has to undergo the processes of flat flexible cable connection and manual soldering, hence raising the manufacturing cost. Furthermore, the soldering accuracy cannot be precisely controlled during the process of manual soldering, hence easily causing damage of the key switch or decrease of the yield.

The present invention aims to propose a control switch connection structure to solve the above problems in the prior art.

SUMMARY OF THE INVENTION

An object of the present invention is to provide a control switch connection structure, in which a control switch is set up on a frame, and conducting strips are electrically connected to a circuit board. The setup steps of flexible printed circuit (FPC) board and flat flexible cable in the prior art can thus be saved to lower the manufacturing cost and shortening the manufacturing process of electronic device.

Another object of the present invention is to provide a control switch connection structure, which does not occupy the usable area of circuit board. The size of circuit board can thus be shrunk to make the volume of the electronic device more miniaturized.

Yet another object of the present invention is to provide a control switch connection structure, whereby the manual soldering process is not required during the assembly process, hence not easily damaging the control switch during the manufacturing process and thus enhancing the yield of electronic device.

To achieve the above objects, a control switch connection structure of the present invention is disposed in an electronic device. The connection structure comprises at least two conducting strips, a circuit board and at least a control switch. The two conducting strips are disposed on the surface of a frame in the electronic device. Each conducting strip has a first conducting end and a second conducting end. The circuit board has at least two first electric contacts. The two first conducting ends are electrically connected to the two first electric contacts, respectively. The control switch is set up on the surface of the frame and located on the two conducting strips. The control switch has at least two second electric contacts. The two second electric contacts are electrically connected to the two second conducting ends, respectively. Electric connection between the control switch and the circuit board can thus be accomplished.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

The present invention provides a control switch connection structure, which is used for setup of a key switch in an electronic device. The electronic device can be a portable device such as a mobile phone, a digital camera, or a digital camcorder. The following embodiment is exemplified with a digital camera. The key switch on a digital camera and the internal circuit board connection structure will be illustrated below.

Figure 1:
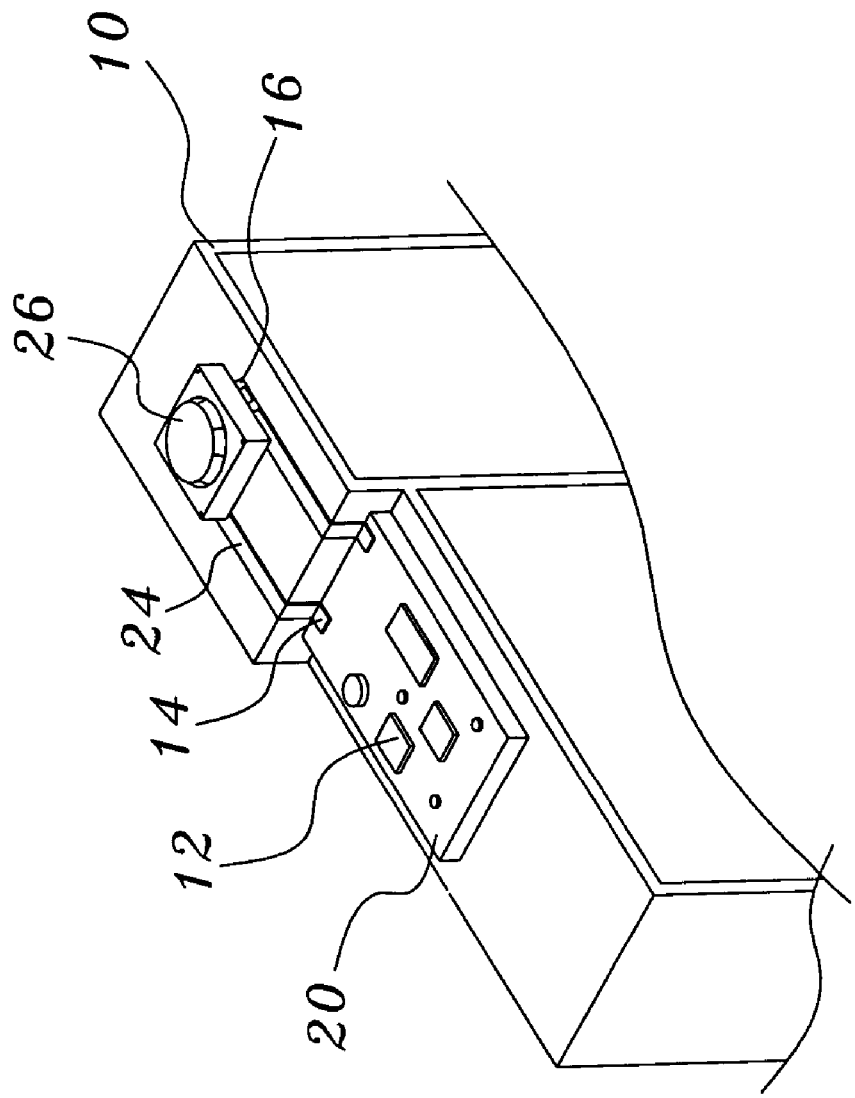
FIG. 1 is a perspective view of the present invention.
Figure 2:
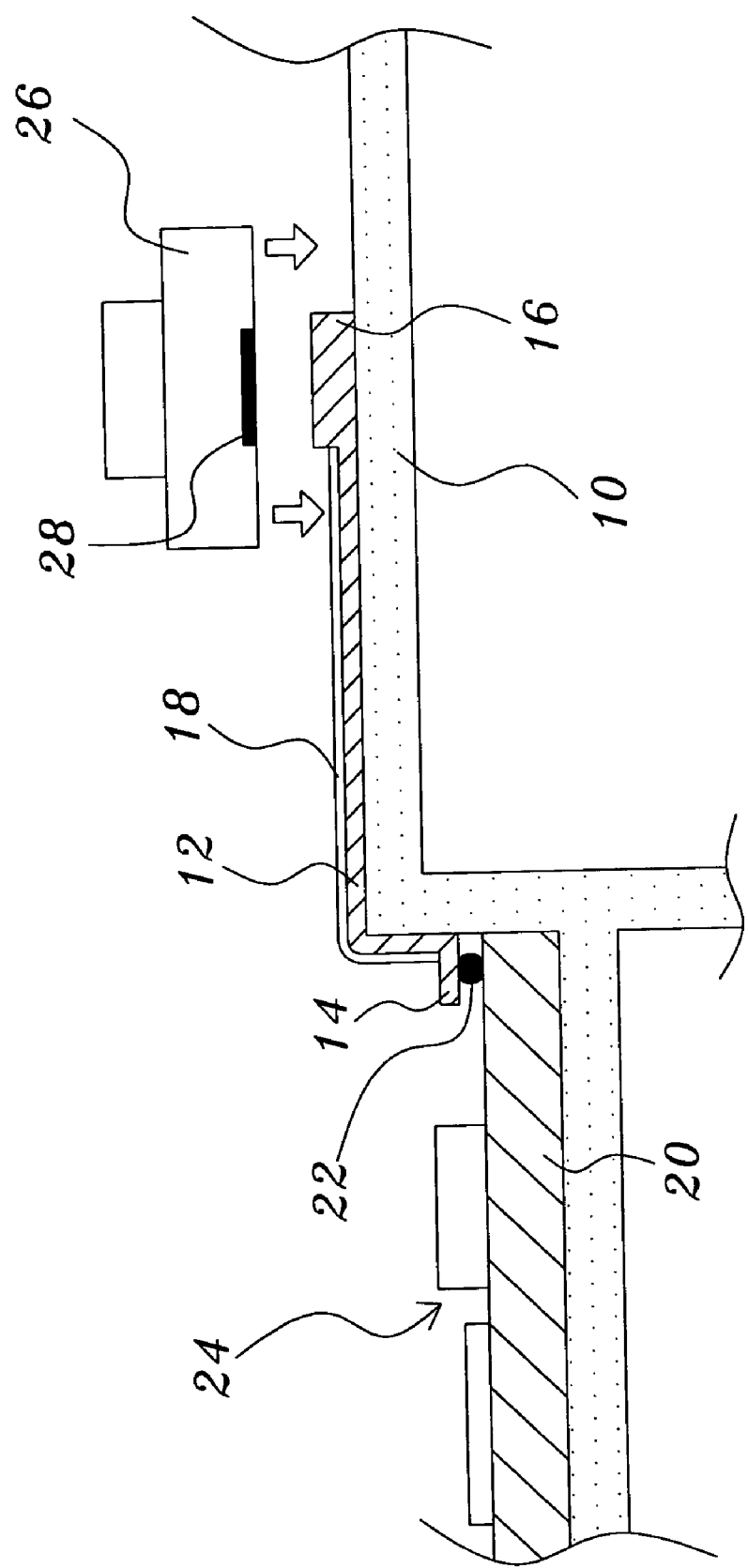
FIG. 2 is a partly enlarged cross-sectional view of the present invention.

As shown in FIGS. 1 and 2, the control switch connection structure is disposed on a frame 10 in a digital camera. The frame 10 can be an assembly component or an injection-molding component. The frame is used for setup of such components as battery and LCD. Two conducting strips 12 are adhered onto the surface of the frame 10. The conducting strips 12 are made of copper or other conducting metals. Each conducting strip 12 has a first conducting end 14 and a second conducting end 16. The second conducting ends 16 are resilient leaves. Each conducting strip 12 is sheathed by a protective layer 18 with only the first conducting end 14 and the second conducting end 16 exposed. The conducting strips 12 can thus be protected from erosion and damage of outside moisture. The protective layer 18 can be epoxy resin or waterproof adhesive tape.

Besides, the frame 10 has a tank for accommodating a battery or an LCD. A circuit board 20 can be disposed on the top face of the tank. The circuit board 20 has two first electric contacts 22. The first conducting ends 14 of the two conducting strips 12 are electrically connected to the two first electric contacts 22, respectively. A plurality of electronic components (e.g., image processor, image sensor, sound effect processor, and so on) is disposed on the. circuit board 20. A control switch 26 is set up on the surface of the frame 10 and located on the two second conducting ends 16 of the two conducting strips 12. The control switch is a surface-type switch, and is set up on the surface of the frame 10 by means of surface mount technology (SMT). The control switch is an elastic push-on switch. A plurality of second electric contacts 28 is disposed at the bottom of the control switch 26. When the control switch 26 is set up on the frame 10, the second conducting ends (resilient leaves) 16 abut against the second electric contacts 28 at the bottom of the controls switch 26 to achieve electric connection between the control switch 26 and the two conducting strips 12, hence electrically connecting the control switch 26 to the circuit board 20.

Besides, there are various different control switches on the digital camera. Each control switch can be set up on the surface of the frame 10 and electrically connected to the circuit board 20 in the same way. A shell body of the digital camera finally clads the frame 10 with each control switch exposed out of the shell body, thereby finishing the assembly of the digital camera.

To sum up, in the present invention, a control switch is set up on a frame and electrically connected to a circuit board via conducting strips. The complicated setup steps of FPC board and flat flexible cable in the prior art can thus be saved to lower the manufacturing cost and shortening the manufacturing process of electronic device. Therefore, the setup of the control switch won't occupy the usable area of circuit board, hence shrinking the size of circuit board and making the volume of the electronic device more miniaturized. Moreover, the manual soldering process is not required during the assembly process of electronic device, hence not easily damaging the control switch during the manufacturing process and thus enhancing the yield of electronic device.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A control switch connection structure disposed in at least a frame of an electronic device, said control switch connection structure comprising:
   at least two conducting strips disposed on a surface of said frame, each said conducting strip having a first conducting end and a second conducting end;
   a circuit board having at least two first electric contacts, said two first conducting ends being electrically connected to said two first electric contacts, respectively, a plurality of electronic components being disposed on said circuit board; and
   at least a control switch having at least two second electric contacts, said control switch being set up on the surface of said frame and located on said two conducting strips, said two second electric contacts being respectively electrically connected to said two second conducting ends to achieve electric connection between said control switch and said circuit board.

2. The control switch connection structure as claimed in claim 1, wherein said frame can be an assembly component or an injection-molding component.

3. The control switch connection structure as claimed in claim 1, wherein said electronic components are selected among image processor, image sensor, and sound effect processor.

4. The control switch connection structure as claimed in claim 1, wherein said conducting strips can further have a protective layer to avoid erosion and damage of said conducting strips.

5. The control switch connection structure as claimed in claim 4, wherein said protective layer is epoxy resin or adhesive tape.

6. The control switch connection structure as claimed in claim 1, wherein said conducting strips are made of copper or other conducting metals.

7. The control switch connection structure as claimed in claim 1, wherein said control switch is set up on the surface of said frame by means of surface mount technology.

8. The control switch connection structure as claimed in claim 1, wherein said electronic device is a digital photography device.

9. The control switch connection structure as claimed in claim 8, wherein said digital photography device is a mobile phone, a digital camera, or a digital camcorder.

10. The control switch connection structure as claimed in claim 1, wherein said two second conducting ends of said conducting strips are resilient leaves, and said resilient leaves abut against said two second electric contacts of said control switch to achieve electric connection when said control switch is set up on the surface of said frame.

11. The control switch connection structure as claimed in claim 1, wherein said electronic device further comprises a shell body capable of sheathing said frame.

* * * * *